(12) United States Patent
Kim et al.

(10) Patent No.: US 7,288,949 B2
(45) Date of Patent: Oct. 30, 2007

(54) SEMICONDUCTOR TEST INTERFACE

(75) Inventors: Dae Kyoung Kim, Suwon (KR); Sun Whan Kim, Yongin (KR); Dal Jo Lee, Seoul (KR)

(73) Assignee: UniTest Inc., Gyeonggi-do (KR)

( * ) Notice: Subject to any disclaimer, the term of this patent is extended or adjusted under 35 U.S.C. 154(b) by 0 days.

(21) Appl. No.: 11/275,768

(22) Filed: Jan. 27, 2006

(65) Prior Publication Data

US 2006/0279305 A1    Dec. 14, 2006

(30) Foreign Application Priority Data

Jun. 10, 2005    (KR) .................. 10-2005-0049869

(51) Int. Cl.
*G01R 31/02* (2006.01)

(52) U.S. Cl. .................................... 324/754

(58) Field of Classification Search ............ 324/754, 324/755, 760, 761–762, 765, 158.1; 439/66–68
See application file for complete search history.

(56) References Cited

U.S. PATENT DOCUMENTS 6,348,789 B1    2/2002    Terao
6,552,528 B2    4/2003    Frame
6,822,436 B2    11/2004   Frame
2002/0130653 A1   9/2002   Frame
2003/0090259 A1   5/2003   Frame
2005/0040811 A1   2/2005   Frame

*Primary Examiner*—Ha Tran Nguyen
*Assistant Examiner*—Tung X. Nguyen
(74) *Attorney, Agent, or Firm*—Sughrue Mion, PLLC

(57) ABSTRACT

The present invention relates to a semiconductor test interface for interfacing a DUT (Device Under Test) to a pin card using a cable comprising a DUT board including one or more first connectors for electrically connecting one or more test sockets for mounting the DUT to the one or more cables, and a circuit wiring for electrically connecting the one or more test sockets to the one or more first connectors; and the one more cable including a second connector for an electrical connection to the one or more first connectors, and a third connector for an electrical connection to the pin card, wherein the one or more first connectors correspond to the one or more cables by 1:1.

In accordance with the present invention, the manufacturing cost is reduced by simplifying the manufacturing process and the semiconductor test interface may easily correspond to the test of the different DUTs.

1 Claim, 5 Drawing Sheets

[Figs]

(PRIOR ART)

(PRIOR ART)

SEMICONDUCTOR TEST INTERFACE

RELATED APPLICATIONS

The present disclosure relates to subject matter contained in priority Korean Application No. 10-2005-0049869 filed on 10 Jun. 2005, which is herein expressly incorporated by reference in its entirety.

BACKGROUND OF THE INVENTION

1. Field of the Invention

The present invention relates to a semiconductor test interface, and more particularly, to a semiconductor test interface for performing a test of a semiconductor device by connecting the semiconductor device to be tested to the semiconductor test equipment.

2. Description of the Related Art

Generally, a test of a semiconductor chip is a final process for determining whether a complete product is a defective product. Semiconductor test equipments for effectively testing multiple products have been developed and are being used.

FIG. 1a is a diagram illustrating an example of a conventional semiconductor test equipment.

As shown, the conventional semiconductor test interface comprises a test body 110, a test head 120 and a semiconductor test interface 130, and one or more DUTs 140a through 140c are mounted on the semiconductor test interface 130 through a handler 150 so as to carry out a test.

Examples of the conventional semiconductor test equipment are disclosed in Korean Patent Application No. 10-2003-0016300 titled "SEMICONDUCTOR TESTER CAPABLE OF DECREASING A DUT BOARDQUANTITY AND ELECTRICAL TESTING METHOD THEREOF" filed by Samsung Electronics on Mar. 15, 2003 and published on Sep. 22, 2004, Korean Patent Application No. 10-2000-7009737 titled "COAXIAL PROBE INTERFACE FOR AUTOMATIC TEST EQUIPMENT" filed by Teradyne Incorporated on Sep. 2, 2000 and published on May 25, 2001, or Korean Patent Application No. 10-2002-7015270 titled "UNIVERSAL TEST INTERFACE BETWEEN A DEVICE UNDER TEST AND A TEST HEAD" filed by Advantest Corporation on Nov. 14, 2002 and published on Mar. 26, 2003.

In addition, a semiconductor test equipment having a motherboard 110 and a test head 120 integrated as a single body in order to reduce a dimension thereof has been developed. FIG. 1b illustrates another example of a conventional test equipment, wherein the semiconductor test interface 130 is mounted on a integrated test head 160 and DUTs 140a through 140c are then mounted on the semiconductor test interface 130 by a handler 150 so as to carry out a test.

Examples of the conventional integrated semiconductor test equipment are disclosed in Korean Patent Application No. 10-2004-45421 titled "SEMICONDUCTOR MODULE TEST EQUIPMENT FOR SIMULTANEOUSLY TESTING MULTIPLE SEMICONDUCTOR MODULES'"" filed by the applicant on Jun. 18, 2004, or Korean Patent Application No. 10-2004-45422 titled "SEMICONDUCTOR COMPONENT TEST EQUIPMENT FOR SIMULTANEOUSLY TESTING MULTIPLE SEMICONDUCTOR COMPONENTS" filed by the applicant on Jun. 18, 2004.

FIG. 2a is a diagram exemplifying a semiconductor test interface used in a conventional test equipment or an integrated test equipment disclosed in Korean Patent Application No. 10-1997-0040701 titled "TEST BOARD FOR IC TESTER" filed by Ando Electric Co., Ltd. on Aug. 25, 1997 and published on Apr. 30, 1998.

As shown, the conventional semiconductor test interface disclosed in Korean Patent Application No. 10-1997-0040701 comprises a DUT unit 210 and a base unit 230.

While a DUT board 220 may comprise one or more connectors and one or more test sockets, description will be focused on a case of a single connector 225 and a single test socket 215.

The DUT unit 210 comprises the test socket 215 for mounting a DUT and the DUT board 220 having the connector 225 for a connection to a cable 240. The DUT board 220 is also referred to as a socket board.

While the base unit 230 may comprise one or more connectors and one or more cables, description will be focused on a case of connectors 235, 245 and 255 and the cable 240.

The base unit 230 comprises the connector 235 for a connection to the connector 225, the connector 245 for a connection to a base board 250, the cable 240, the base board 250 and the connector 255 for a connection to a connector 275 of a pin card 270 disposed in the test body. The pin card 270 is included in the test body or a test head, generates a test pattern for a test of the DUT to be output to the DUT (Device Under Test), and is referred to as various terms such as a pattern generating board.

In addition, FIG. 2b is a perspective view illustrating a combination of the base unit 230 and the pin card 270.

As shown, the base board 250 is an interface for transmitting an output signal from the pin card 270 to the DUT through the DUT unit 210. The base board 250 comprises the connector 255 for a connection to the connector 275 used for the pin card 270, and connectors 245a through 245x for an interface between connectors 225 used for a signal transmission to the DUT board 220 through a connection of the cable 240a. While the base board 250 also comprises multiple cables 240a through 240x and connectors 235a through 235x and 245a through 245x, these are identical to the connectors 235a and 245a and the cable 240a. Therefore, a detailed description is omitted.

As shown, an integrated connector having a large gap between long pins is used as a connector 275a generally used for the pin card 270 in order to facilitate a mechanical contact. Therefore, an integrated connector corresponding to the integrated connector having a large gap is used as the connector 255. In addition, the connectors 245a through 245x are configured to transmit a signal to a plurality of connectors 255 through the connectors 235a through 235x.

The base board 250 comprises a circuit wiring for carrying out a signal interface between the connector 255 and the connector 245a because the structures of the connector 255 and the connector 245a through 245x are different.

The configuration disclosed in Korean Patent Application No. 10-1997-0040701 overcomes a disadvantage of conventional semiconductor test interface wherein a configuration of a DUT unit or a base unit thereof is complex, and a maintenance and high-speed transmission of high frequency signal are difficult due to a connection using a soldering or a pogo pin. In addition, the configuration disclosed in Korean Patent Application No. 10-1997-0040701 may correspond to a test of different types of DUTs by changing a connector housing of the connector 245 to change a connection line.

However, while the configuration disclosed in Korean Patent Application No. 10-1997-0040701 is advantageous in that the number of contact points such as a solder is less than the conventional configuration, it is disadvantageous to the high-speed signal transmission. Moreover, while the integrated connector is advantageous to a mechanical contact and support, the integrated connector is disadvantageous in that a high frequency wave characteristic is degraded. In addition, in accordance with an aspect of the maintenance of the semiconductor test equipment, since the semiconductor test equipment is divided into the base unit and the DUT unit, each of the units should be separately maintained, thereby making a manufacturing process more complex and increasing a manufacturing cost. Moreover, although the configuration may correspond to the test of the different types of the DUTs by changing the connector housing of the connector 245 to change the connection line, the connector housing of the connector 245 must changed one by one.

FIG. 2c is a diagram exemplifying another semiconductor test interface used in a conventional test equipment or an integrated test equipment disclosed in Korean Patent Application No. 10-2002-7015270 by Advantest Corporation.

Korean Patent Application No. 10-2002-7015270 discloses a configuration wherein a connector 228 is disposed below a DUT board 220 and is electrically connected to a connector 285 disposed in a board spacer 280 through a cable 240. An SCI (shielded controlled impedance), for example, is used as the connector 285, and the configuration is designed to have the number of the connector 228 less than that of the connector 285 so that the test of the different types of the DUTs may be carried out by changing only a connection between the connector 228 of the DUT board 220 and the connector 285.

However, in accordance with the configuration, a manufacturing cost is increased due to an addition of a board spacer 280 and a maintenance thereof is difficult. Moreover, the number of connector contacts is increased to degrade a high frequency wave characteristic. Since the number of the connector 228 does not correspond to that of the connector 285 by 1:1, that is the number of the connector 228 is smaller than that of the connector 285, the connector 228 of the DUT board 220 should be rearranged every time the DUT is changed.

It is very important that a configuration of the semiconductor test interface is simplified with respect to an operation of the semiconductor test equipment related to a high frequency signal processing since semiconductor test equipment processes multiple DUTs such as 256 or 512 DUTs currently.

Therefore, a demand for a semiconductor test interface wherein the high-speed transmission signal integrity is improved by minimizing the number of connector contacts and the maintenance of the semiconductor test equipment is facilitated by simplifying the semiconductor test interface is increasing.

SUMMARY OF THE INVENTION

It is an object of the present invention to provide a semiconductor test interface wherein the number of the connector contact points is minimized, the signal integrity of the high-speed transmission signal is improved and the maintenance of the semiconductor test interface is facilitated by simplifying the semiconductor test interface, thereby reducing the manufacturing cost by simplifying the manufacturing process and easily corresponding to the test of the different DUTs.

In order to achieve the above-described objects of the present invention, there is provided a semiconductor test interface for interfacing a DUT (Device Under Test) to a pin card using one or more cables, the test interface comprising: a DUT board including one or more first connectors for electrically connecting one or more test sockets for mounting the DUT to the one or more cables, and a circuit wiring for electrically connecting the one or more test sockets to the one or more first connectors; and the one or more cables including a second connector for an electrical connection to the one or more first connectors, and a third connector for an electrical connection to the pin card, wherein the one or more first connectors correspond to the one or more cables by 1:1.

It is preferable that the pin card comprises one or more fourth connectors corresponding to the third connector by 1:1, the one or more fourth connectors corresponding to the one or more first connectors through the one or more cables by 1:1.

It is also preferable that each of the one or more fourth connectors comprises two or more fifth connectors for connecting a plurality of the third connectors thereto, the one or more fourth connectors corresponding to the one or more first connectors through the one or more cables by 1:(2 or more).

DETAILED DESCRIPTION OF THE INVENTION

Embodiments in accordance with the present invention will now be described in detail with reference to the accompanied drawings.

Figure 1A:
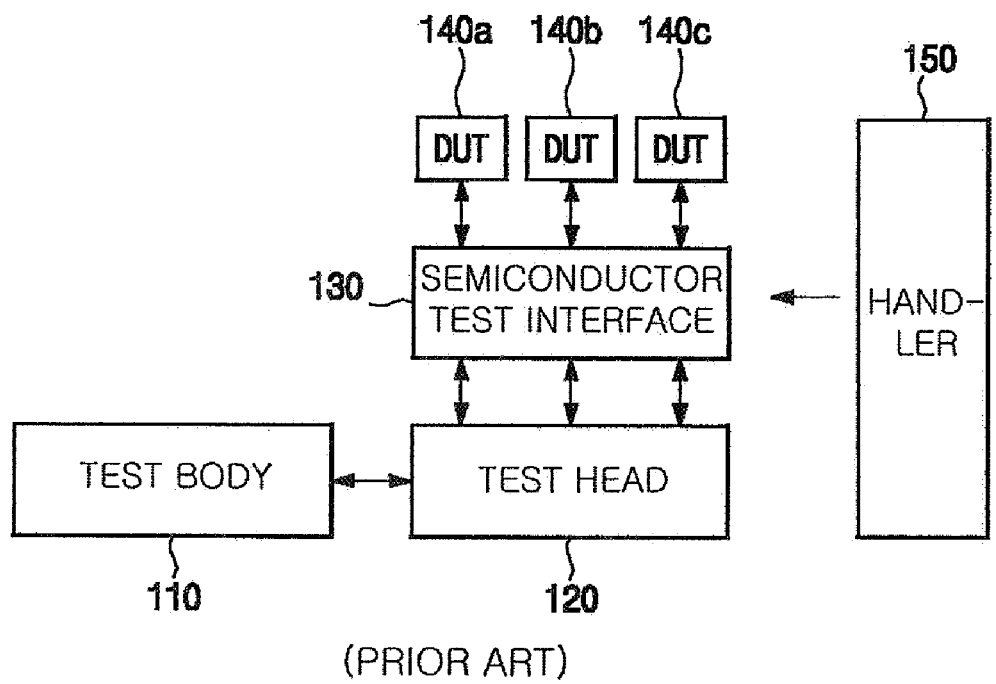
FIG. 1 is a diagram illustrating a conventional semiconductor test interface.
Figure 1B:
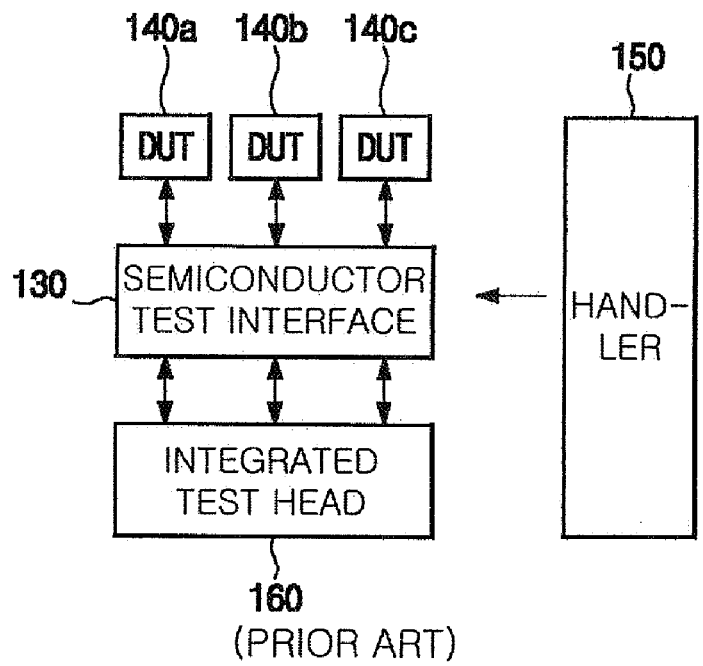
Figure 2A:
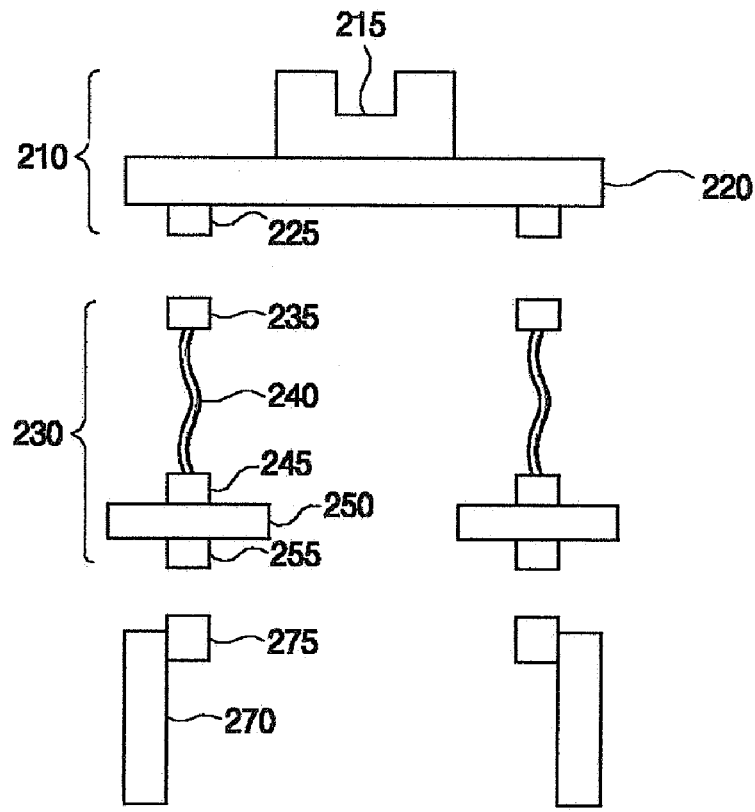
FIGS. 2a through 2c are diagrams exemplifying a semiconductor test interface used in a conventional test equipment or an integrated test equipment.
Figure 2B:
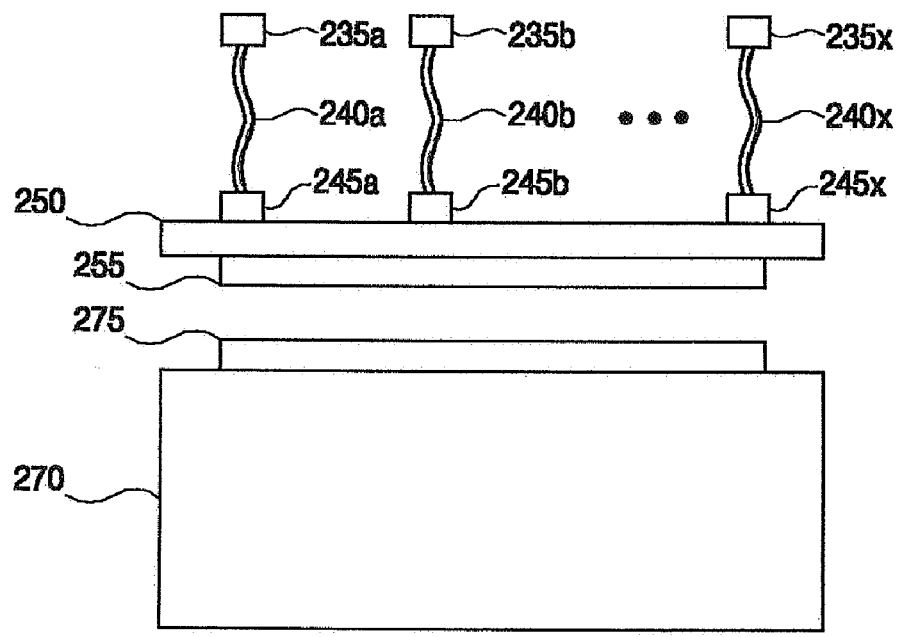
Figure 2C:
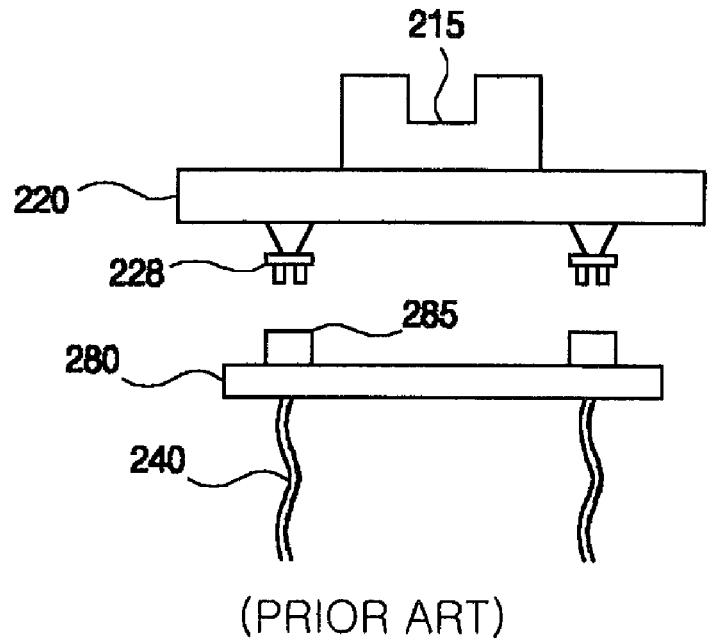
Figure 3:
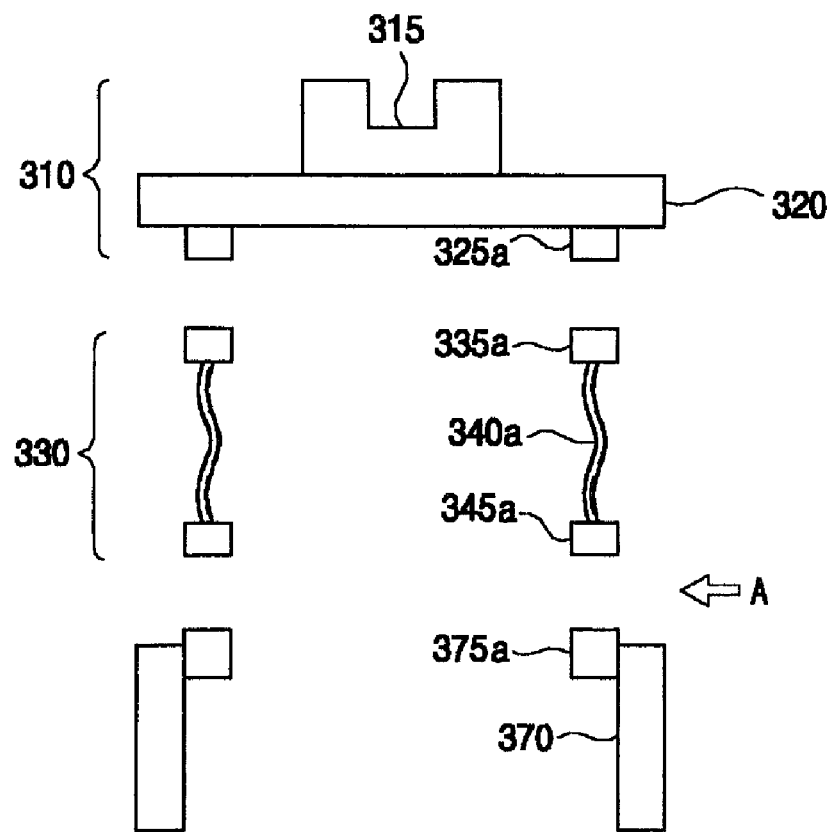
FIG. 3 is a diagram illustrating a configuration of a semiconductor test interface in accordance with the present invention.

FIG. 3 is a diagram illustrating a configuration of a semiconductor test interface in accordance with the present invention.

As shown, the semiconductor test interface in accordance with the present invention may be divided into a DUT unit 310 and a base unit 330, and comprises a DUT board 320 including a test socket 315 for mounting a DUT and a first connector 325a and a cable 340a having a second connector 335a and a third connector 345a at two end portions thereof respectively. It should be noted that the connectors 325a 335a and 345a of the present invention refers to a socket, receptacle or a general connector having a conductive material for an electrical connection therein.

While the DUT board 320 may comprise one or more test sockets 315 and one or more first connectors, description will be focused on a case of the single test socket 315 and the single first connector 325a.

The test socket 315 is a test interface for applying a signal to a DUT or transmitting an output signal from the DUT to carry out a test by mounting the DUT through a handler or manually.

One or more first connectors 325a is disposed corresponding to the test socket 315, and is electrically connected to a plurality of electric contacts of the test socket 315 through a circuit wiring in the DUT board 320.

While the cable is disposed to correspond to the number of the first connectors 325a description will be focused on the first connector 325a connected to the cable 340a.

The cable 340a includes the second connector 335a for an electrical connection to the first connector 325a and the third connector 345a for an electrical connection to the pin card 370 at the two end portions thereof, respectively.

It is preferable that the cable 340a comprises a cable for transmitting high frequency wave.

Figure 4A:
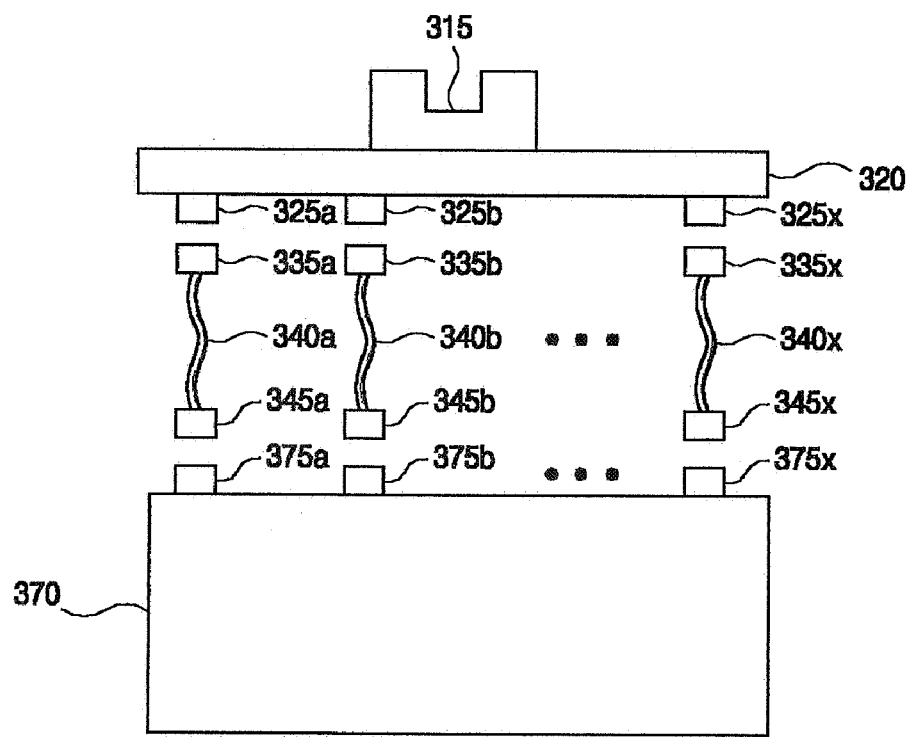
FIGS. 4a through 4c are diagrams illustrating a connection between the semiconductor test interface and a pin card in accordance with the present invention.
Figure 4B:
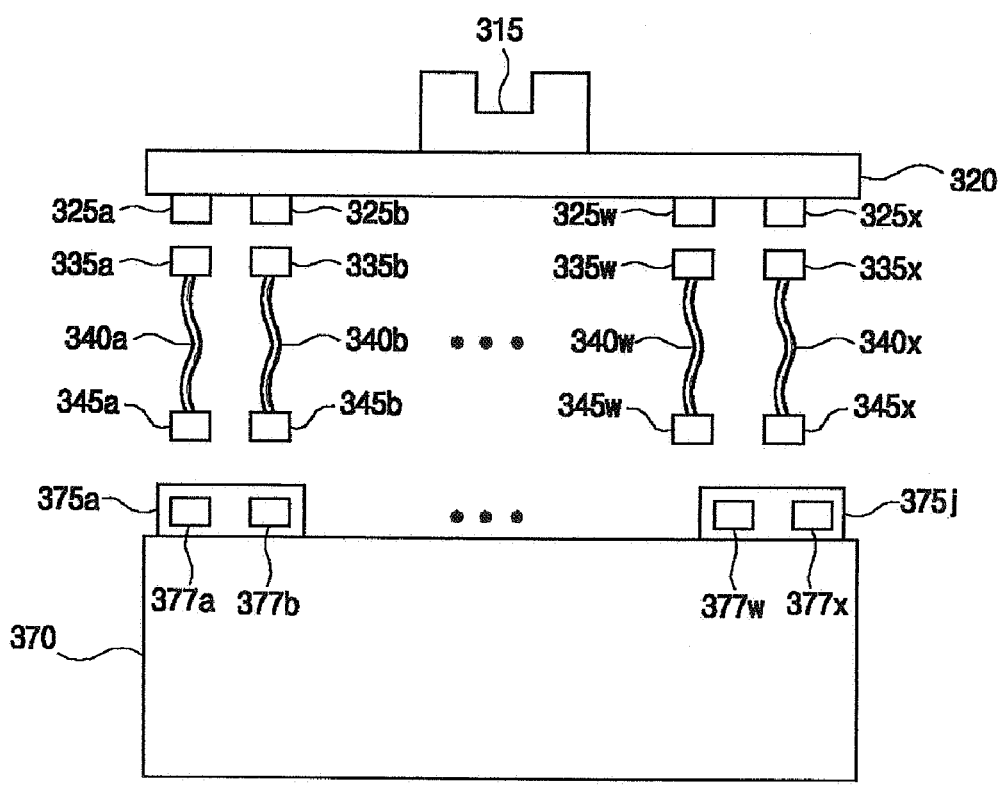
Figure 4C:
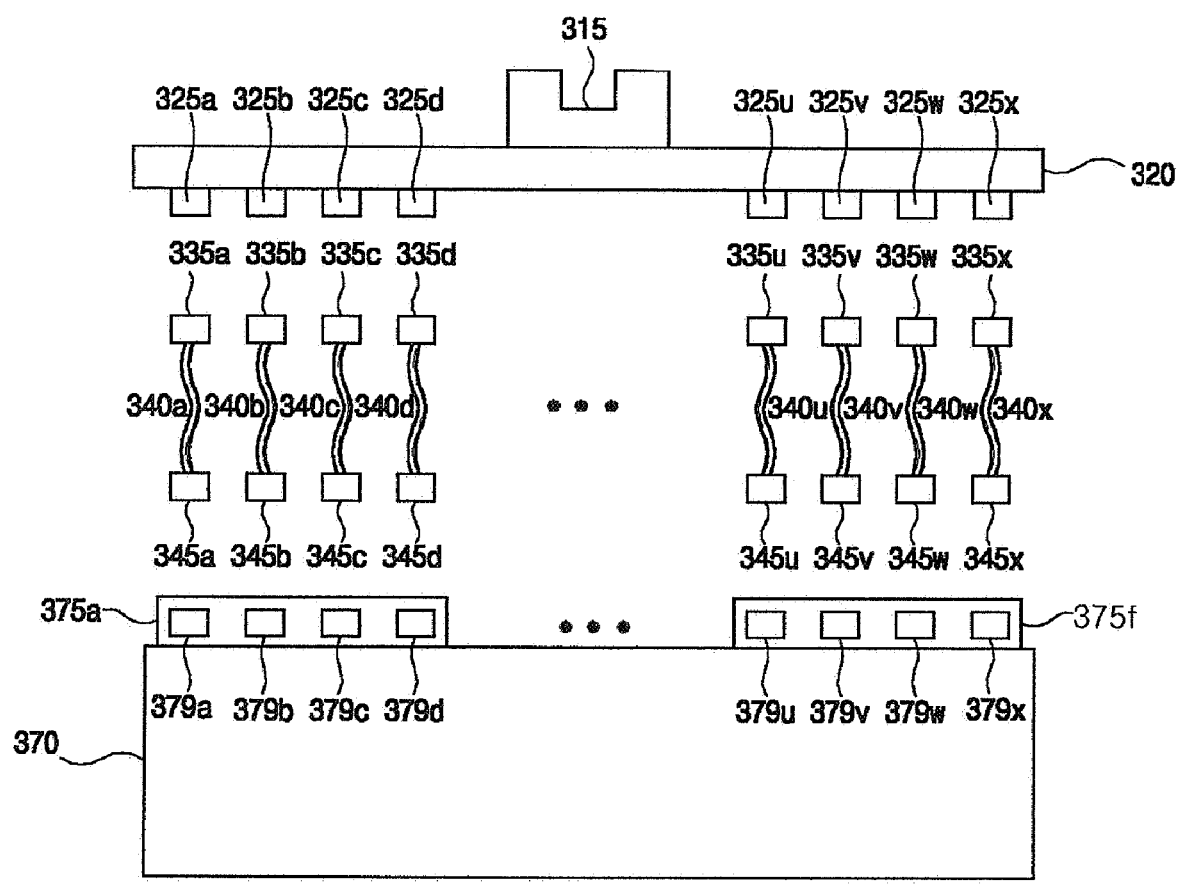

FIGS. 4a through 4c are diagrams illustrating a connection between the semiconductor test interface and the pin card in accordance with the present invention, which are side views of FIG. 3 taken from a direction of arrow A.

FIG. 4a illustrates third connectors 345a through 345x of the semiconductor test interface in accordance with the present invention corresponding to fourth connectors 375a through 375x of the pin card 370 by 1:1.

The reason for using a base board in the conventional semiconductor test interface is that a connector used in the pin card is an integrated connector and a wiring for a signal interface between the integrated connector and the connector used for the cable is required, which is carried out by the base board.

However, in accordance with the semiconductor test interface of the present invention shown in FIG. 4a, since the base board is removed and the fourth connectors 375a through 375x of the pin card 370 are configured to correspond to the third connectors 345a through 345x by 1:1, a separate base board is not required to be added to the configuration of the semiconductor test interface. Therefore, a degradation of a high-speed transmission characteristic due to a solder connection to the base board or a use of multiple connectors is prevented.

FIG. 4b illustrates the third connectors 345a through 345x of the semiconductor test interface in accordance with the present invention corresponding to the fourth connectors 375a through 375j of the pin card 370 by 2:1, that is, two of the third connectors are connected to one of the connector of the pin card 370 simultaneously.

As shown, the fourth connectors 375a through 375j include two fifth connectors 377a through 377x corresponding to the third connectors for connecting two of the third connectors, respectively.

In accordance with the above-described embodiment, similar to FIG. 4a, since a use of a solder or connector is minimized without using the base board, the degradation of a high-speed transmission characteristic is prevented.

FIG. 4c illustrates a configuration wherein the third connectors 345a through 345x correspond to the fourth connectors 375a through 375f of the pin card 370 by 4:1, that is four of the third connectors correspond to one of the connectors of the pin card simultaneously.

As shown, the fourth connectors 375a through 375f include four fifth connectors 379a through 379x corresponding to the third connectors for connecting four of the third connectors, respectively.

In accordance with the above-described embodiment, similar to FIG. 4a or 4b, since a use of a solder or connector is minimized without using the base board, the degradation of a high-speed transmission characteristic is prevented.

In addition, a configuration wherein three third connectors are simultaneously connected to one connector of the pin card 370 or five third connectors are simultaneously connected to one connector of the pin card 370 is also possible.

The semiconductor test interface in accordance with the present invention described with reference to FIG. 3 or FIGS. 4a through 4c differs from the conventional semiconductor test interface in that the semiconductor test interface in accordance with the present invention employs the second connector 335a and the third connector 345a connected to the end portions of the cable 340a without using a separate interface such as the base board in the base unit 330 and that the DUT board 320 is directly connected to the pin card 370 through the cable 340a. A manufacturing process of the semiconductor test interface is simplified and a manufacturing cost thereof is reduced due to the simplified base unit 330.

In addition, the configuration of the base unit 330 solves a problem of a signal distortion in the high-speed signal transmission of the conventional semiconductor test interface generated by an existence of multiple connection contact points due to the base board or a board spacer and a use of multiple connectors for the base board by minimizing the number of the connectors, thereby improving the signal integrity.

Moreover, in accordance with an aspect of a maintenance of the base unit 330, while a test for determining where of the base board or the cable a failure has occurred is required in the conventional art, only a replacement of a corresponding cable is necessary in the semiconductor test interface of the present invention. Therefore, the maintenance of the base unit 330 is facilitated.

In addition, in a test of different DUTs, a change of a configuration of the base unit 330 is not necessary contrary to the conventional semiconductor test interface because the test is possible by only replacing the DUT unit without changing the base unit 330. That is, the third connector 345 of the cable 340 connected to the pin card 370 does not need to be changed every time the DUT is changed, and only determining a signal of which cable is to be received from the DUT unit 310 is necessary.

While the present invention has been particularly shown and described with reference to the preferred embodiment thereof, it will be understood by those skilled in the art that various changes in form and details may be effected therein without departing from the spirit and scope of the invention as defined by the appended claims.

As described above, in accordance with the present invention, since the pin card and the DUT unit is connected by using only the cable and the connector without using the base board to minimize the number of the connector contact points, the signal integrity of the high-speed transmission signal is improved and the maintenance of the semiconductor test interface is facilitated by simplifying the semiconductor test interface. Therefore, the manufacturing cost is reduced by simplifying the manufacturing process and the semiconductor test interface may easily correspond to the test of the different DUTs.

The invention claimed is:

1. A semiconductor test interface for interfacing a DUT (Device Under Test) to a pin card using one or more cables, the test interface comprising:

a DUT board including one or more first connectors for electrically connecting one or more test sockets for mounting the DUT to the one or more cables, and a circuit wiring for electrically connecting the one or more test sockets to the one or more first connectors; and the one or more cables including a second connector for an electrical connection to the one or more first connectors, and a third connector for an electrical connection to the pin card, wherein the one or more first connectors correspond to the one or more cables by 1:1, wherein the pin card comprises one or more fourth connectors corresponding to the third connector by 1:1, the one or more fourth connectors corresponding to the one or more first connectors through the one or more cables by 1:1, and wherein each of the one or more fourth connectors comprises two or more fifth connectors for connecting a plurality of the third connectors thereto, the one or more fourth connectors corresponding to the one or more first connectors through the one or more cables by 1:(2 or more).

* * * * *